United States Patent

Lee

[11] Patent Number: 5,770,502
[45] Date of Patent: Jun. 23, 1998

[54] METHOD OF FORMING A JUNCTION IN A FLASH EEPROM CELL BY TILT ANGLE IMPLANTING

[75] Inventor: Hee Youl Lee, Daejeon, Rep. of Korea

[73] Assignee: Hyundai Electronics Industries, Co., Ltd., Kyungki-Do, Rep. of Korea

[21] Appl. No.: 656,446

[22] Filed: May 31, 1996

[30] Foreign Application Priority Data

Jun. 2, 1995 [KR] Rep. of Korea .................. 1995-14561

[51] Int. Cl.⁶ ............................................... H01L 21/8247
[52] U.S. Cl. ........................................... 438/264; 438/302
[58] Field of Search ..................................... 438/257, 263, 438/264, 286, 302, 303, 525, 594

[56] References Cited

U.S. PATENT DOCUMENTS

| | | | |
|---|---|---|---|
| 5,021,848 | 6/1991 | Chiu | 438/264 |
| 5,190,887 | 3/1993 | Tang et al. | 438/264 |
| 5,413,946 | 5/1995 | Hong | 438/264 |
| 5,432,109 | 7/1995 | Yamada | 438/302 |

*Primary Examiner*—Chandra Chaudhari
*Attorney, Agent, or Firm*—Fish & Richardson P.C.

[57] ABSTRACT

The present invention forms a modified DDD junction structure in which a DDD structure is formed on stack gate structure side on which a floating gate and a control gate are laminated and a non-DDD structure is formed on split gate side, by forming a first impurity region through a tilt angle implanting of impurity ions at a high level of energy and then forming a second impurity region through a tilt angle implanting of impurity ions at a low level of of energy using a spacer.

6 Claims, 2 Drawing Sheets

METHOD OF FORMING A JUNCTION IN A FLASH EEPROM CELL BY TILT ANGLE IMPLANTING

FIELD OF THE INVENTION

The present invention relates to a method of forming a junction in a flash EEPROM cell, more particularly to a method of forming a DDD (Double Diffused Drain) junction in a flash EEPROM cell of a split gate type having a submicron channel length.

BACKGROUND OF THE INVENTION

A method of forming a DDD junction will be explained with reference to FIG. 1A through FIG. 1C.

FIG. 1A through FIG. 1C show sectional views of a device for explaining a method of forming a junction in a conventional flash EEPROM cell.

In FIG. 1A, there is shown a sectional view of the device, in which, after a tunnel oxide film 2 is formed on a silicon substrate 1, a floating gate 3, a dielectric film 4, a control gate 5, and an oxide film 6 are sequentially formed in a stack structure and a first photoresist pattern 7 is formed through a lithography process using a source/drain impurity ion implantation mask. A first impurity region 8A is then formed through a source/drain impurity ion implantation process.

In FIG. 1B, there is shown a sectional view of the device, in which, after the first photoresist pattern 7 is removed, the first impurity region 8A is enlarged through an annealing process.

In FIG. 1C, there is shown a sectional view, in which, after a second photoresist pattern 9 identical to the first photoresist pattern 7 is formed through a lithography process using a source/drain impurity ion implantation mask, a second impurity region 8B, completely confined within the first impurity region 8A, is formed through a source/drain impurity ion implantation process. As a result, a junction 8 with a DDD structure comprising the first and second impurity regions 8A, 8B is formed.

The problem with, the above mentioned method is that it must be performed using two consecutive mask processes. In addition, there are difficulties in the annealing process. Furthermore, when the junction with a DDD structure is used as a drain for the cell, there is no problem in operating the cell, however, when the junction is used as a source for the cell, threshold voltage of the cell is lowered as well as punch-through phenomenon occurs.

SUMMARY OF THE INVENTION

The purpose of the present invention is to provide a method of forming a junction in a flash EEPROM cell by forming a modified DDD junction structure without using a source/drain impurity ion implantation mask and an annealing process, which can reduce the manufacturing steps and can maintain a split gate channel length in the cell.

A method of forming a junction in a flash EEPROM cell to accomplish the above purpose in accordance with the present invention comprises the steps of forming a tunnel oxide film on a silicon substrate; forming a stack gate structure where a floating gate, a dielectric film, a control gate and an oxide film are sequentially formed on the film; forming a thin nitride film on the resulting structure including the stack gate structure; forming a first impurity region in the silicon substrate through a tilt angle implant process of impurity ions at an energy of over 100 KeV; forming a spacer oxide film on the side walls of the stack gate structure; and forming a second impurity region confined within the first impurity region through a tilt angle implant process of impurity ions at an energy of less than 100 KeV, and thereby, forming a modified DDD junction structure. The DDD structure is formed on the stack gate structure side on which a floating gate and a control gate are stacked, and a non-DDD structure is formed on the split gate side, wherein the length of the split gate is determined based on the height of the stack gate structure and the tilt angle incident when impurity ions are implanted.

BRIEF DESCRIPTION OF THE DRAWINGS

For fuller understanding of the nature and objects of the invention, reference should be had to the following detailed description taken in conjunction with the accompanying drawings in which.

Similar reference characters refer to similar parts through the several views of the drawings.

DETAILED DESCRIPTION OF THE INVENTION

Below, the present invention will be explained in detail with reference to the accompanying drawings.

Figure 2A:
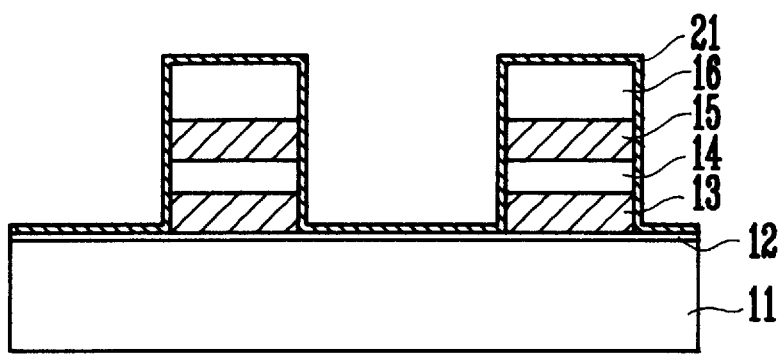
FIG. 2A through FIG. 2C show sectional views of a device for explaining a method of forming a junction in a flash EEPROM cell according to the present invention.
Figure 2B:
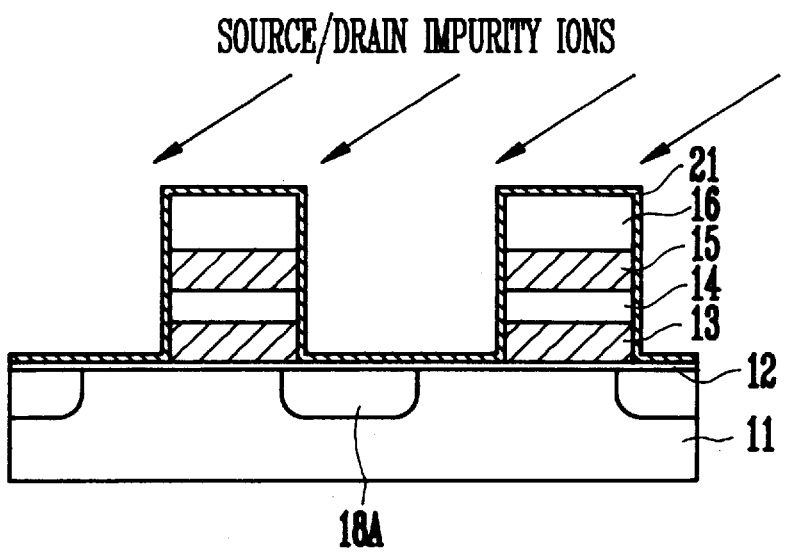
Figure 2C:
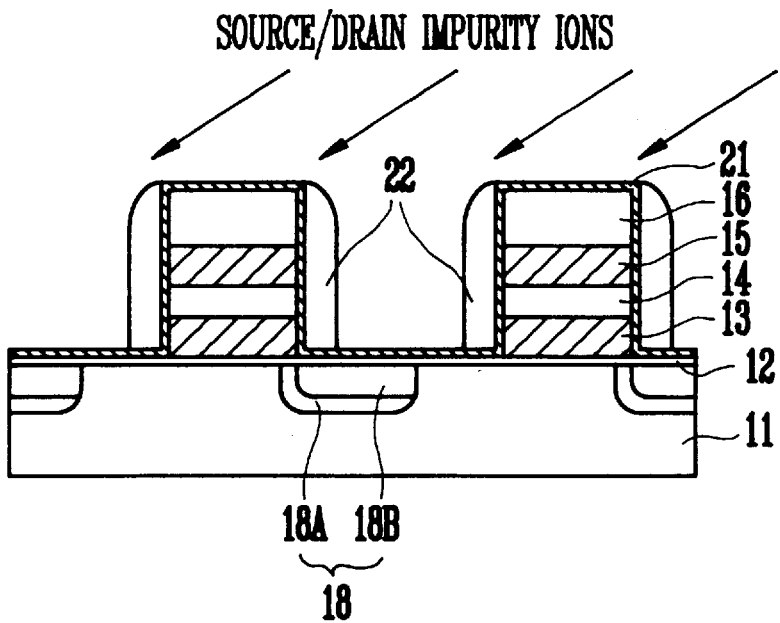

FIG. 2A through FIG. 2C show sectional views of a device for explaining a method of forming a junction in a flash EEPROM cell according to the present invention.

FIG. 2A shows a sectional view of the device in which a tunnel oxide film 12 is formed on a silicon substrate 11, upon which a stack gate structure, in which a floating gate 13, a dielectric film 14, a control gate 15 and an oxide film 16 are sequentially laminated, is formed. Then, a thin nitride film 21 is formed on the resulting stack gate structure, including the silicon substrate 11 stack gate structure.

FIG. 2B shows a sectional view of the device in which a first impurity region 18A is formed in the silicon substrate through a tilt angle implant process of impurity ions at an energy of 100 through 160 KeV without using a source/drain impurity ion implantation mask.

In FIG. 2A and FIG. 2B, the nitride film 21 may be formed before or after the tilt angle implant process of impurity ions.

FIG. 2C shows a sectional view of the device in which, after a spacer oxide film 22 is formed on the side walls of the stack gate structure a second impurity region 18B confined within the first impurity region 18A is formed in the silicon substrate through a tilt angle implant process of impurity at an energy of 40 through 100 KeV. As a result, the modified junction 18 comprising the first and second impurity regions 18A, 18B is formed.

Thereafter, a flash EEPROM cell of a split gate type is manufactured by the resulting formation of the split gate upon removal of the spacer oxide film 22 and the nitride film 21.

Figure 1A:
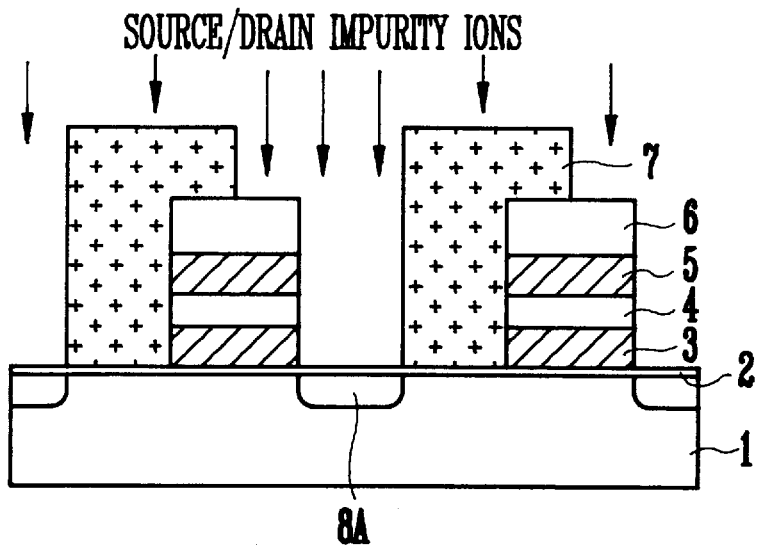
FIG. 1A through FIG. 1C show sectional views of a device for explaining a method of forming a junction in a conventional flash EEPROM cell.
Figure 1B:
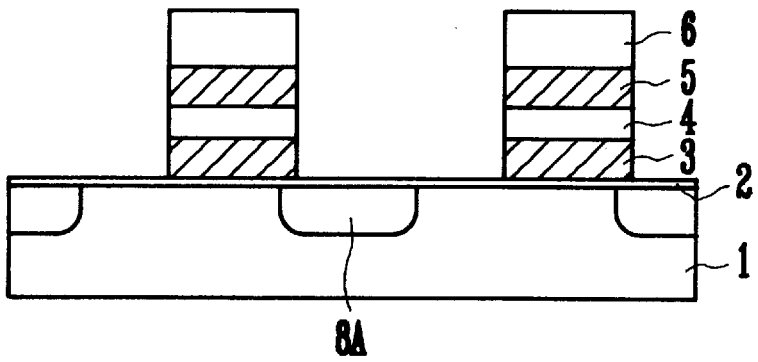
Figure 1C:
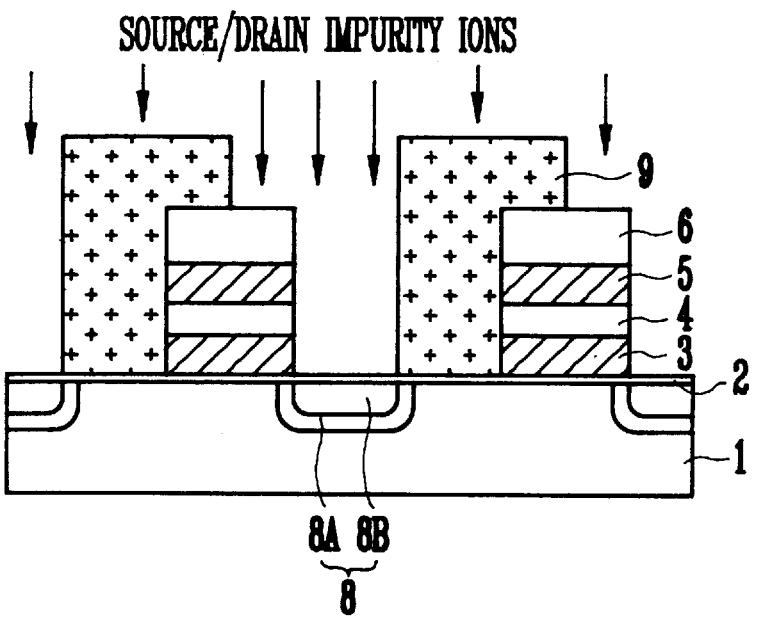

The structure of the modified DDD junction 18, shown in FIG. 2C, according to the present invention, is different from that of the conventional DDD junction 8, shown in FIG. 1C. The portion of the modified junction 18 overlapped with the stack gate structure is formed with a DDD structure, while the other portion of the modified junction which is not overlapped with the stack gate is formed with a non-DDD structure. Accordingly, when the modified junction 18 of the present invention is used as a drain of the cell, the characteristics of the cell can be improved as with the conventional junction 8. When the modified junction 18 of the present invention is used as a source of the split gate, the junction can prevent shortening of the channel length, reduction of the threshold voltage and occurrence of punch-through phenomenon because that portion of the junction is not a DDD structure.

As mentioned above, the first and second impurity regions are formed by a tilt angle impurity ions implant process. However, the formation of the first impurity region use a high level energy while the formation of the second impurity region use a low level energy.

Accordingly, the present invention can omit mask processes for forming a DDD structure having first and second impurity regions, and an annealing process for diffusing a first impurity region, and also it can improve the characteristics of the split gate and reduce the cell size.

The foregoing description, although described in its preferred embodiment with a certain degree of particularity, is only illustrative of the principle of the present invention. It is to be understood that the present invention is not to be limited to the preferred embodiments disclosed and illustrated herein. Accordingly, all expedient variations that may be made within the scope and spirit of the present invention are to be encompassed as further embodiments of the present invention.

What is claimed is:

1. A method of forming a junction in a flash EEPROM cell, comprising the steps of:

forming a tunnel oxide film on a silicon substrate;

forming a stack gate structure where a floating gate, a dielectric film, a control gate and an oxide film are sequentially formed;

forming a thin nitride film on the resulting structure including said stack gate structure;

forming a first impurity region in said silicon substrate through a tilt angle implant process of impurity ions;

forming a spacer oxide film on the side walls of said stack gate structure; and forming a second impurity region included within said first impurity region through a tilt angle implant process of impurity ions, thereby forming a junction region in said silicon substrate.

2. The method of claim 1, wherein a portion of said junction region overlapped with said stack gate structure is formed in a DDD structure, while the other portion of said junction region which is not overlapped with said stack gate structure is formed with a non-DDD structure.

3. The method of claim 1, wherein said tilt angle implanting of impurity ions for forming said first impurity region is practised at an energy of 100 through 160 KeV, and said tilt angle implanting of impurity ions for forming said second impurity region is practised at an energy of 40 through 100 KeV.

4. A method of forming a junction in a flash EEPROM cell, comprising the steps of;

forming a tunnel oxide film on a silicon substrate;

forming a stack gate structure where a floating gate, a dielectric film, a control gate and an oxide film are sequentially formed;

forming a first impurity region in said silicon substrate through a tilt angle implant process of impurity ions;

forming a thin nitride film on the resulting structure including said stack gate structure;

forming a spacer oxide film on the side walls of said stack gate structure; and forming a second impurity region included within said first impurity region through a tilt angle implant process of impurity ions, thereby forming a modified junction structure comprising said first and second impurity regions.

5. The method of claim 4, wherein a portion of said junction region overlapped with said stack gate structure is formed in a DDD structure, while the other portion of said junction region which is not overlapped with said stack gate structure is formed with a non-DDD structure.

6. The method of claim 4, wherein said tilt angle implanting of impurity ions for forming said first impurity region is practised at an energy of 100 through 160 KeV, and said tilt angle implanting of impurity ions for forming said second impurity region is practised at an energy of 40 through 100 KeV.

* * * * *